United States Patent [19]

Mukai et al.

[11] Patent Number: 5,376,559
[45] Date of Patent: Dec. 27, 1994

[54] METHOD OF MANUFACTURING A LATERAL FIELD EFFECT TRANSISTOR

[75] Inventors: Mikio Mukai, Kanagawa; Masahiko Einaga, Miyazaki; Yutaka Hayashi, Kanagawa, all of Japan

[73] Assignee: Sony Corporation, Tokyo, Japan

[21] Appl. No.: 172,731

[22] Filed: Dec. 27, 1993

[30] Foreign Application Priority Data

Dec. 28, 1992 [JP] Japan ............................. 4-348228
May 6, 1993 [JP] Japan ............................. 5-105554

[51] Int. Cl.5 ............................................ H01L 21/265
[52] U.S. Cl. ......................................... 437/29; 437/30; 437/41; 437/62; 148/DIG. 12
[58] Field of Search .................. 437/21, 29, 30, 41, 437/42, 50, 62, 64, 228, 910, 917, 974, 956.26; 257/316, 31, 36, 39; 148/DIG. 12, DIG. 135

[56] References Cited

U.S. PATENT DOCUMENTS

| | | | |
|---|---|---|---|
| 3,445,303 | 5/1969 | Engbert | 148/187 |
| 4,980,308 | 12/1990 | Hayashi | 437/41 |
| 5,091,330 | 2/1992 | Cambou et al. | 437/62 |
| 5,238,865 | 8/1993 | Eguchi | 437/62 |

FOREIGN PATENT DOCUMENTS 59-154084  9/1984  Japan .
3-232239  10/1991  Japan .

*Primary Examiner*—George Fourson
*Assistant Examiner*—David M. Mason
*Attorney, Agent, or Firm*—Hill, Steadman & Simpson

[57] ABSTRACT

A lateral insulating gate type field effect transistor can be manufactured with ease reliably by using a semiconductor substrate having excellent crystal property. A projected portion (2) is formed on a first major surface side of a semiconductor substrate (1). A first gate portion (3) having a width (length) smaller than that of the projected portion (2) is formed on the projected portion (2). An insulating layer (4) is formed on the whole surface of the semiconductor substrate (1) so as to bury the first gate portion (3). The semiconductor substrate (1) is removed horizontally from its second major surface side, i.e., from the opposite side of the side of the projected portion (2) to a position (a) at which the insulating layer (4) is formed so as to bury the projected portion (2) is exposed. A second gate portion (5) is formed on such exposed surface.

7 Claims, 6 Drawing Sheets

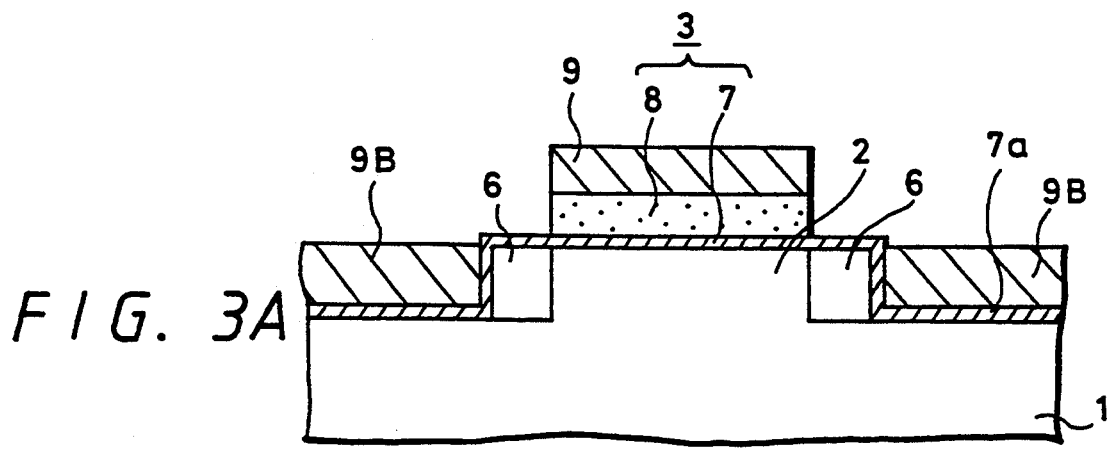
F I G. 3A
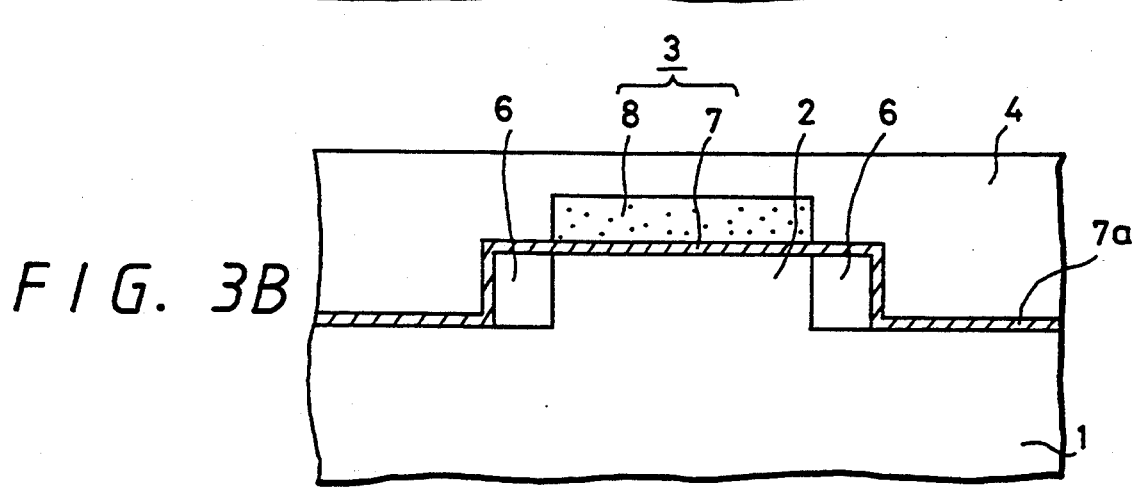
F I G. 3B
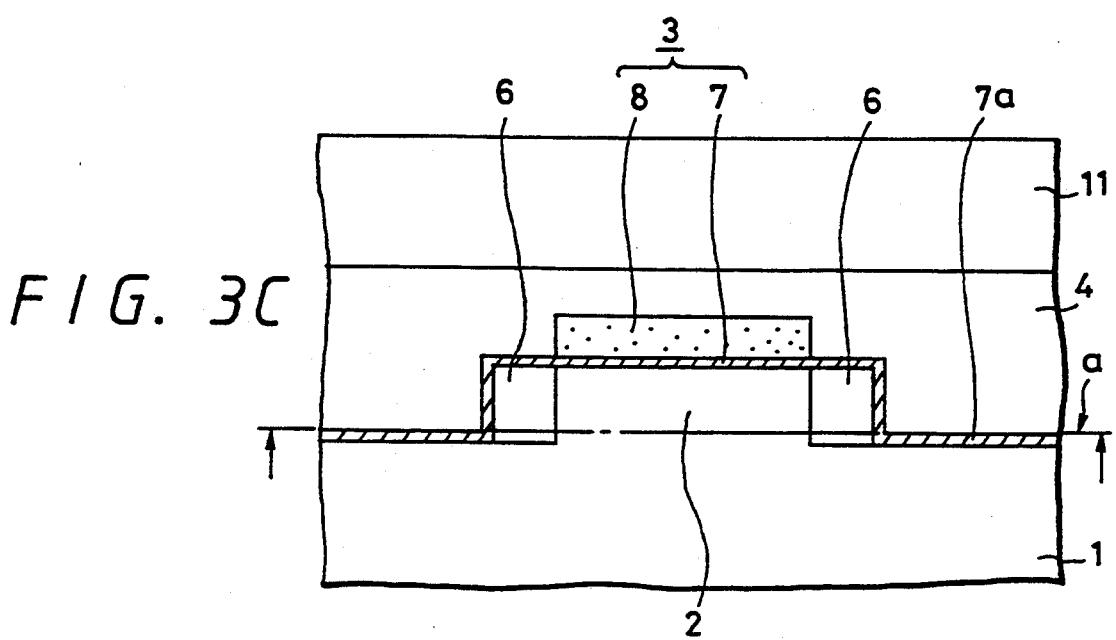
F I G. 3C

5,376,559

METHOD OF MANUFACTURING A LATERAL FIELD EFFECT TRANSISTOR

BACKGROUND OF THE INVENTION

1. Field of the Invention

The present invention generally relates to a method of manufacturing a lateral insulating gate type field effect transistor and, more particularly, is directed to a method of manufacturing a lateral insulating gate type field effect transistor for use in manufacturing a so-called XMOS transistor whose channel region is sandwiched by a pair of gate portions.

2. Description of the Prior Art

FIG. 1 of the accompanying drawings shows a schematic cross-sectional view of an example of a conventional so-called XMOS transistor. As shown in FIG. 1, first and second gate electrodes $33G_1$, $33G_2$ are respectively formed on upper and lower surfaces of a semiconductor layer 31 of a low impurity concentration type, i.e., $p^-$ type or $n^-$ type or intrinsic i-type which serves as a channel forming portion through gate portions, i.e., gate insulating films 32 in an opposing fashion. Source or drain regions 34 made by the ion implantation of n-type or p-type impurity are respectively formed on the semiconductor layer 31 across the portion where these gate portions are formed.

The XMOS transistor thus arranged has excellent characteristics that are not obtained by an ordinary MOS transistor, such as no punch-through, an excellent switching characteristic and characteristics being controllable without introducing an impurity into the channel region.

When in the XMOS transistor the first and second gate portions, i.e., the two gate electrodes $33G_1$ and $33G_2$ are independently applied with control voltages to independently control the first and second gate portions, freedom in controlling the first and second gate portions is increased and much more excellent transistor characteristics can be obtained.

Lateral solid phase epitaxy growth techniques nave heretofore been proposed as a method of manufacturing the XMOS transistor in which the upper and lower gate portions are controlled independently. According to these lateral solid phase epitaxy growth techniques, a crystalline property of the epitaxial growth layer is not perfect so that a device having an excellent carrier mobility cannot be obtained.

OBJECTS AND SUMMARY OF THE INVENTION

Therefore, it is an object of the present invention to provide an improved method of manufacturing a lateral MIS (metal insulator semiconductor) field effect transistor in which the aforesaid shortcomings and disadvantages of the prior art can be eliminated.

More specifically, it is an object of the present invention to provide a method of manufacturing a lateral MIS field effect transistor in which first and second gate portions can be controlled independently and can be manufactured.

Another object of the present invention is to provide a method of manufacturing a lateral insulating gate type field effect transistor in which a lateral insulating gate type field effect transistor can be manufactured by using a semiconductor substrate having excellent crystal property with ease reliably.

According to an aspect of the present invention, provided is a method of manufacturing a lateral insulating gate type field effect transistor which is comprised of the steps of forming a projected portion on a first major surface side of a semiconductor substrate, forming a first gate portion on said projected portion, forming an insulating layer on the whole surface of said semiconductor substrate by burying said first gate portion, removing said semiconductor substrate from a second major surface side of said semiconductor substrate to a position of said insulating layer in which said projected portion is buried, and forming a second gate portion on a bottom surface of said protruded portion.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIGS. 2A through 2C, FIGS. 3A through 3C, FIGS. 4A, 4B, and FIGS. 5A, 5B are process diagrams used to explain a method of manufacturing a lateral MIS field effect transistor according to an embodiment of the present invention, respectively.

DETAILED DESCRIPTION OF THE PREFERRED EMBODIMENTS

Embodiments of a method of manufacturing a lateral MIS field effect transistor according to the present invention will hereinafter be described with reference to the drawings.

Figure 1:
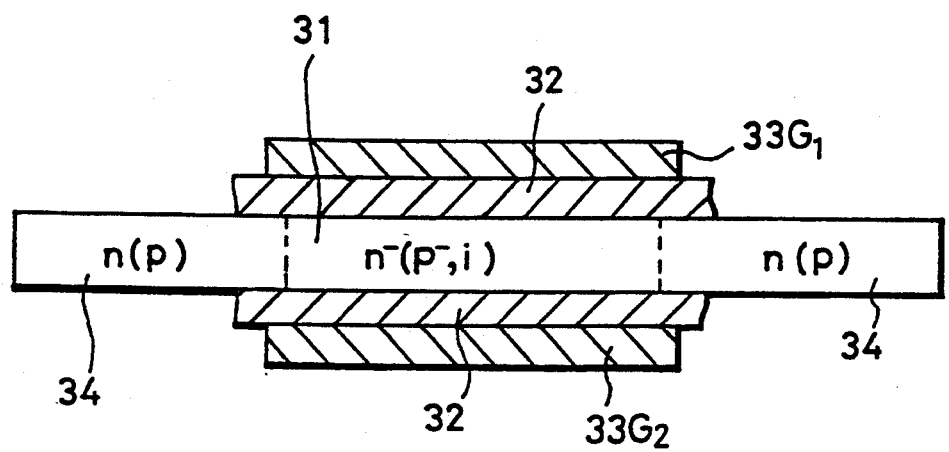
FIG. 1 is a schematic cross-sectional view showing an example of a conventional XMOS transistor.
Figure 2A:
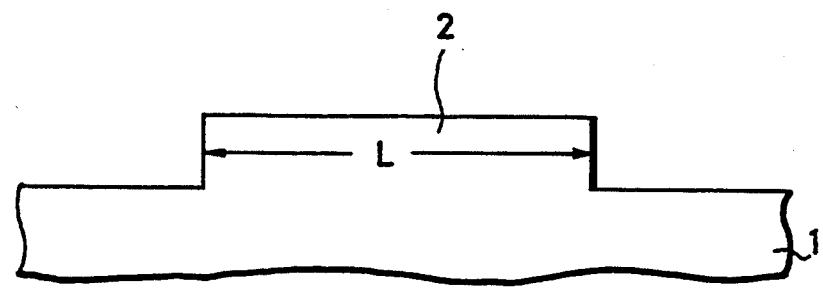

Initially, as shown in FIG. 2A, provided is a semiconductor substrate, e.g., single crystal silicon body 1 on one major surface of which there is formed a stripe-shaped protruded portion 2 having a predetermined length (width) L extended in the direction perpendicular to the sheet of drawing, for example, by a selective etching process using a photo-lithography from one major surface side. The length L of the protruded portion 2 is selected to be a length L that corresponds to a sum of a channel length and a width of a source or drain region of a finally obtained XMOS transistor or the like.

Figure 2B:
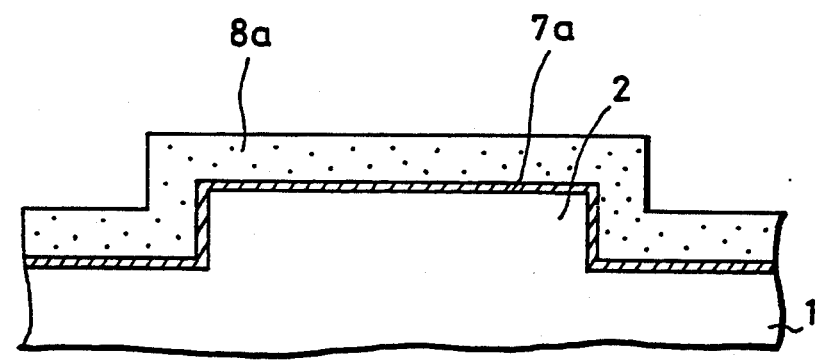

Subsequently, as shown in FIG. 2B, on the whole surface of the single crystal body 1 is formed an insulating film 7a one portion of which finally serves as a gate insulating film by an $SiO_2$ oxide film having a thickness of several 10s of to several 100s of Angstroms that is formed by thermally oxidizing the surface of the single crystal body 1, for example.

On the whole surface of the insulating film 7a is formed a conductive layer 8a whose one portion finally serves as a first gate electrode, e.g., a polycrystalline silicon layer whose resistivity is lowered by impurity doping according to a CVD (chemical vapor deposition) method or the like.

Figure 2C:
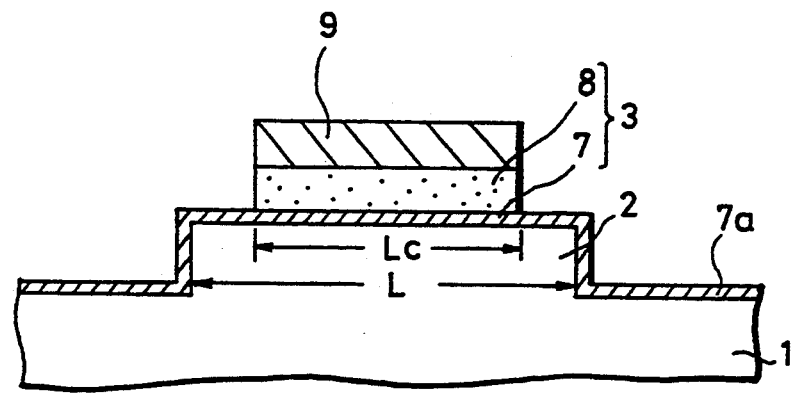

Subsequently, as shown in FIG. 2C, a photo-resist layer 9 having a length Lc corresponding to a finally obtained channel length smaller than the length L of the protruded portion 2 is formed on the conductive layer 8 on the protruded portion 2 by an optical technique. The conductive layer 8 and the insulating layer 7 formed under the conductive layer 8 when necessary are etched away by using the photo-resist layer 9 as a mask to form a first gate portion 3 in which a gate insulating layer 7 formed of a part of the insulating layer 7a and a first gate electrode 8 formed of a part of the conductive layer 8a are formed. In this case, when the next process is an ion implantation process and the oxide film 7a is as thin as several 10s of nanometers, it is frequently observed that the oxide film 7a is left on other portions, such as the source region and the drain region, etc., as shown in FIG. 2C.

Then, as shown in FIG. 3A, source or drain regions 6 are formed on the semiconductor substrate 1 at its respective sides of the gate portion 3 by the ion implantation technique with the photo-resist layer 9 and the gate electrode 8 being used as masks. In this case, prior to the ion implantation, an ion implantation mask 9B, such as a photo-resist layer or the like is formed in advance on the semiconductor substrate 1 at its portion where the ion implantation is not carried out.

As shown in FIG. 3B, on the whole of the semiconductor substrate 1 is formed an insulating layer 4 of SiO$_2$ or the like that is made by a low temperature CVD using TEOS (tetra ethyl ortho silicate) or instead thereof or by depositing PBSG (phosphor boron silicate glass) on the whole surface and then made flat.

Subsequently, as shown in FIG. 3C, other substrate or supporting base 11, e.g., silicon supporting base is bonded onto the insulating layer 4.

Figure 4A:
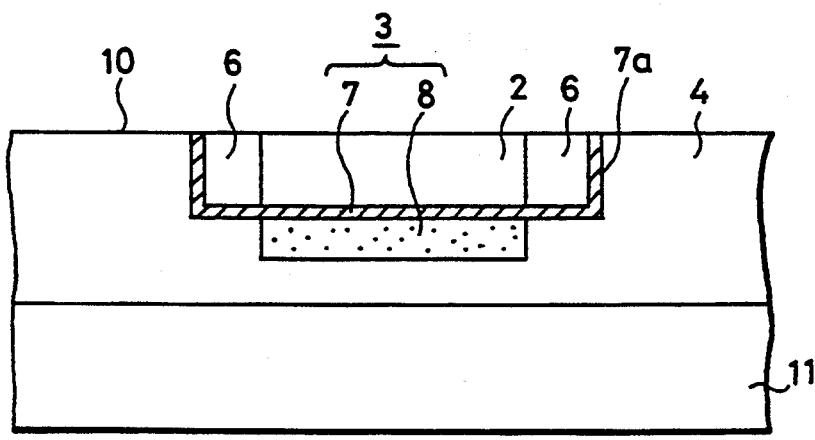

As shown in FIG. 4A, a planarization plane 10 is formed by polishing the substrate 1 from its rear surface, i.e., the major surface of the substrate 1 opposite to the side having the protruded portion 2 to a position shown by a broken line a in FIG. 3C (the position shown by the broken line a represents the position on the boundary surface between the portion in which the protruded portion 2 of the substrate 1 is not formed and the insulating layer 4 or the position a little projected toward the insulating layer 4 side from the boundary surface) up to the position where the insulating layer 4 and the protruded portion 2 are exposed by a chemical mechanical polish (CMP). With the above-mentioned arrangement, a channel forming portion in which the source or drain region 6 is formed respectively by the protruded portion 2 on the planarization plane 10 is exposed to the outside. In this case, if a polishing material or slurry that cannot polish the insulating layer 4 and that can polish the material of the substrate 1 with ease is employed as the polishing material, then the thickness of the channel forming portion is formed as substantially the same value as the height of the initially formed protruded portion 2 with good reproducibility.

Figure 4B:
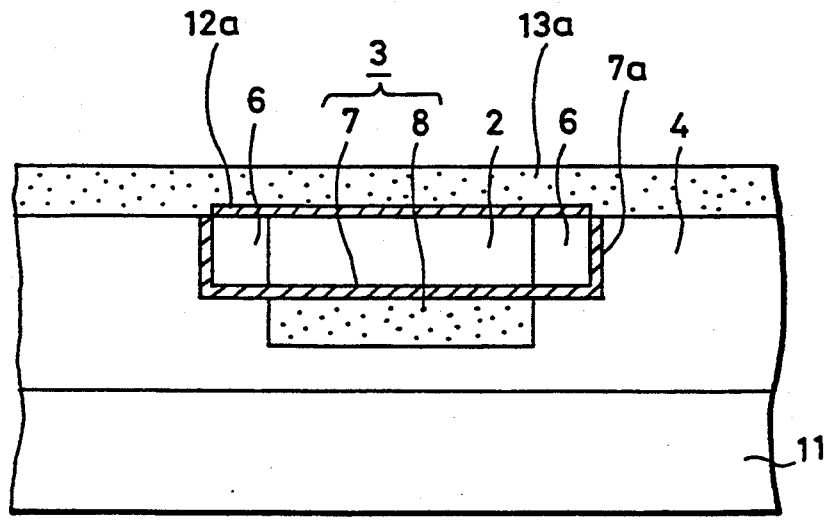

Then, an insulating layer 12a whose one portion finally becomes a second gate insulating layer is formed by thermally oxidizing the protruded portion 2 exposed to the surface 10, i.e., the channel forming semiconductor portion, as shown in FIG. 4B. Subsequently, on the insulating layer 12a is formed a conductive layer 13a one portion of which finally becomes a second gate electrode similarly so as to correspond to the forming portion of the protruded portion 2 by a low resistivity polycrystalline silicon formed by a CVD, for example.

Figure 5A:
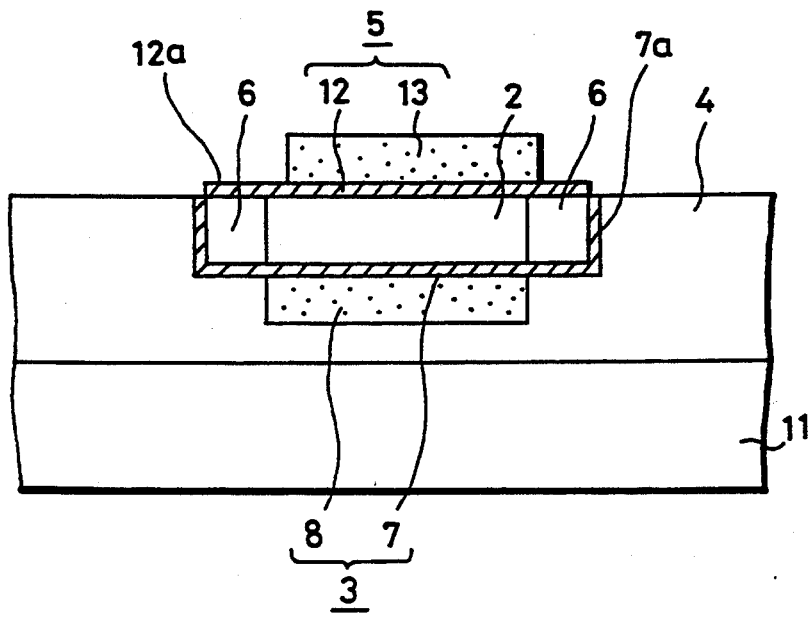

As shown in FIG. 5A, a second gate electrode 13 is formed by effecting a pattern etching using a photolithography.

In this way, the second gate electrode 13 and the second gate insulating layer 12 formed of one portion of the insulating layer 12a formed beneath the second gate electrode 13 constitute a second gate portion 5.

Figure 5B:
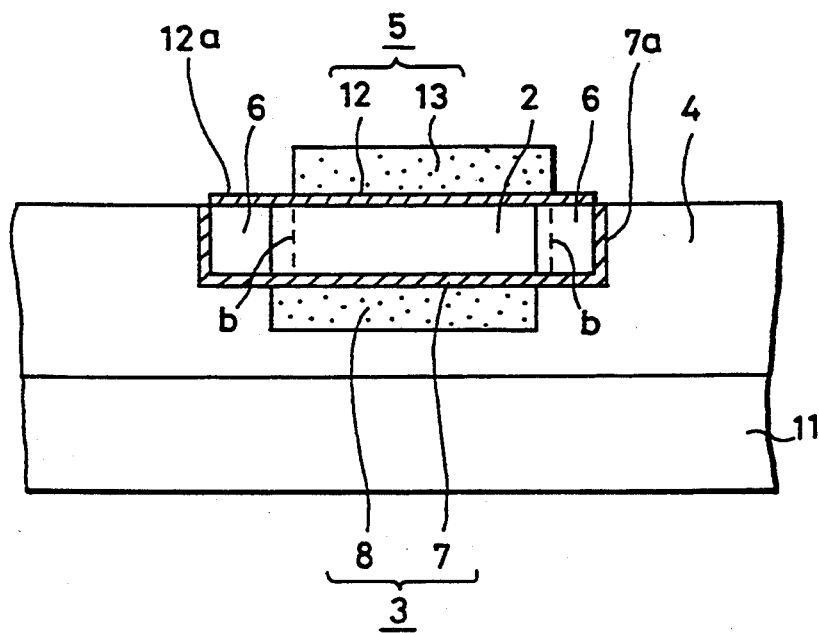

As shown in FIG. 5B, using the second gate portion 5 as the mask, impurity of the same conductivity type as that of the previously-formed source or drain region 6 is further ion-implanted so as to include the previously-formed source or drain region, i.e., the source region or drain region 6 that is matched with the first gate portion 3 is further matched with the second gate portion 5.

Figure 6:
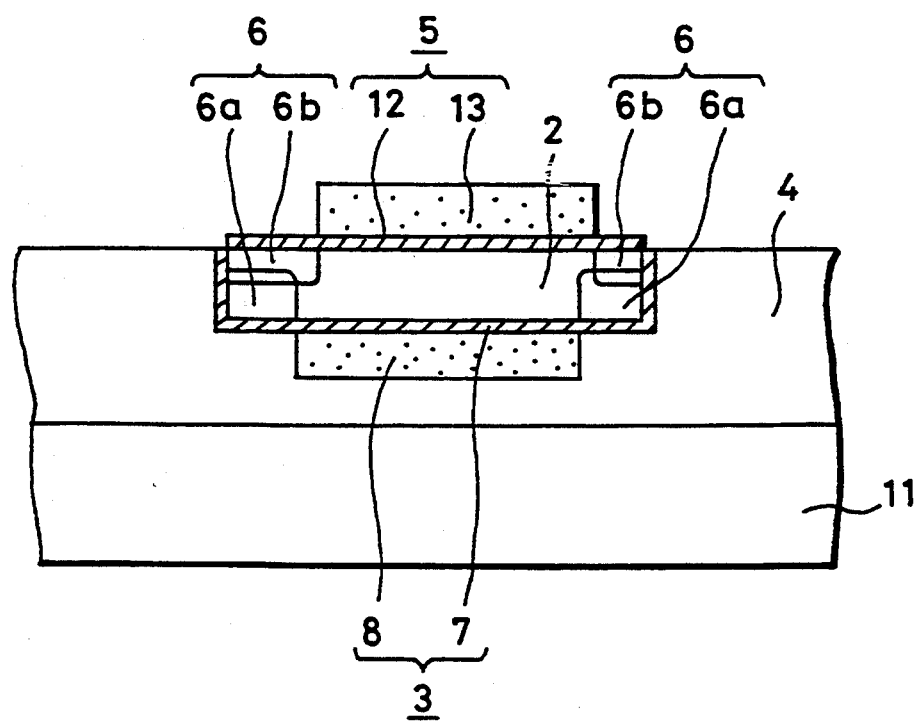
FIG. 6 is a schematic cross-sectional view showing a lateral MIS field effect transistor manufactured by a method according to another embodiment of the present invention.

In this case, if an accuracy at which the first and second gate portions are matched with each other is poor, then the overlapping portion of the source or drain region and the gate electrode is increased. As a consequence, a stray capacitance of the transistor is increased and an electrical characteristic thereof also is deteriorated. In order to improve such a deteriorated electrical characteristic, a depth of the impurity implantation used when the source or drain region 6 is formed by using the first gate portion 3 as the mask and a depth of the impurity implantation used when the source or drain region 6 is formed by using the second gate portion 5 as the mask are adjusted. More specifically, as shown in FIG. 6, when the source or drain region is formed by using the first gate portion 3 as the mask, the source or drain region 6a is formed only on the gate portion 3 side of the channel portion so as not to reach the channel forming position surface on the gate portion 5 side. Similarly, when a source or drain region 6b is formed by using the second gate portion 5 as the mask, the source or drain region 6b is formed only on the gate portion 5 side of the channel forming portion. Thus, these regions 6a and 6b constitute the source or drain region 6. With the above-mentioned structure, the increase of the stray capacitance can be avoided.

While the source or drain region is formed by the impurity implantation using the first gate portion 3 as the mask as described above in connection with FIG. 3A, the present invention is not limited thereto and the above-mentioned arrangement may be omitted. That is, the source or drain region 6 that is matched with the second gate electrode 5 may be formed by effecting the ion implantation on the source or drain region once using the second gate portion 5 described in connection with FIG. 5A as the mask portion. Conversely, the ion implantation on the source or drain region using the second gate portion 5 as the mask as described in connection with FIG. 5A may be omitted. In any cases, the impurity that is used to form the source or drain region is reached from one surface of the channel forming semiconductor region to the other surface thereof.

According to the manufacturing method of the present invention, the protruded portion 2 is formed on the semiconductor substrate 1, this protruded portion is used as the channel forming region and the first gate portion 3 is formed on the upper surface thereof. Thereafter, the base body 11, i.e., so-called reinforcing base body 11 is formed on the first gate portion 3 through the insulating layer 4. Also, the substrate 1 is polished from the other surface and the second gate portion 2 is formed on the bottom portion side of the exposed protruded portion 2. Thus, the first and second gate electrodes 3 and 5 can be formed at both sides of the channel forming portion, i.e., the channel forming portion formed by the protruded portion 2.

Further, in particular, the source or drain region 6 may be formed by using the first gate electrode 8, described in connection with FIG. 3A, as the mask after the first gate electrode 8 was formed or may be formed by the ion implantation using the second gate electrode 5 shown in FIG. 5A as the mask. When there is the risk that inconsistency, i.e., offset between the first and second gate portions 3 and 5 will occur, the source or drain region 6 can be matched to both of the first and second gate portions 3 and 5 by carrying out the ion implantation twice by using the first and second gate portions 3 and 5 as the masks.

According to the structure of the present invention, the protruded portion 2 is formed on the semiconductor substrate 1 and then the first gate portion 3 is formed on the protruded portion 2. Thereafter, the second gate portion 5 is formed on the other surface, i.e., the bottom surface of the exposed protruded portion 2 by carrying out the polishing process such that the bottom portion of the protruded portion 2 is exposed. Therefore, the lateral type XMOS can be formed reliably by using the semiconductor substrate having excellent crystalline property.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing a lateral insulated gate field effect transistor comprising the steps of:
    forming a projected portion on a first major surface side of a semiconductor substrate;
    forming a first gate portion on said projected portion;
    forming an insulating layer on the resulting surface of said semiconductor substrate by burying said first gate portion;
    removing said semiconductor substrate from a second major surface side of said semiconductor substrate to a position of said insulating layer in which said projected portion is burled to expose the bottom surface of said projected portion;
    forming a second gate portion on a portion of the bottom surface of said projected portion.

2. A method of manufacturing a lateral insulated gate field effect transistor according to claim 1, wherein the process for removing said semiconductor substrate is a chemical mechanical polish (CMP).

3. A method of manufacturing a lateral insulated gate field effect transistor according to claim 1, further comprising a step for forming a source region or a drain region by using said first gate portion as a mask.

4. A method of manufacturing a lateral insulated gate field effect transistor according to claim 1, further comprising a step for forming a source region or a drain region after the step of forming said second gate portion.

5. A method of manufacturing a lateral insulated gate field effect transistor according to claim 1, further comprising a step for forming a portion of a source region or a drain region by using said first gate portion as a mask and a step for forming a portion of the source region or the drain region by using said second gate portion as a mask.

6. A method of manufacturing a lateral insulated gate field effect transistor according to claim 5, wherein the portion of the source or drain region that is formed by using said first gate portion as a mask is overlapped by the portion of the source or drain region formed by using said second gate portion as a mask.

7. A method of manufacturing a lateral insulated gate field effect transistor according to claim 5, wherein the depths of the portion of said source or drain region formed by using said first gate portion as the mask and the portion of the source or drain region formed by using the second gate portion as the mask are selected such that they are prevented from reaching the opposite sides of their channel forming regions and that said corresponding source or drain regions are brought in contact with each other.

* * * * *